(12) United States Patent
Yamazaki et al.

(10) Patent No.: US 7,268,487 B2
(45) Date of Patent: Sep. 11, 2007

(54) LIGHT-EMITTING APPARATUS

(75) Inventors: Shunpei Yamazaki, Tokyo (JP); Toru Takayama, Kanagawa (JP); Takuya Tsurume, Kanagawa (JP); Yuugo Goto, Kanagawa (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 45 days.

(21) Appl. No.: 10/662,357

(22) Filed: Sep. 16, 2003

(65) Prior Publication Data

US 2004/0056589 A1 Mar. 25, 2004

(30) Foreign Application Priority Data

Sep. 20, 2002 (JP) .............................. 2002-276382

(51) Int. Cl.
*H05B 33/12* (2006.01)
(52) U.S. Cl. ...................................... 313/506; 313/512
(58) Field of Classification Search ........ 313/498–512, 313/306, 307, 308; 252/500, 520.1; 548/316.4; 525/426, 445, 455; 428/421; 345/36, 45, 345/76; 315/169.3
See application file for complete search history.

(56) References Cited

U.S. PATENT DOCUMENTS

| 3,977,767 | A | * | 8/1976 | Okuma et al. ............... 349/123 |
| 4,455,324 | A | | 6/1984 | Kamijo et al. |
| 4,580,818 | A | * | 4/1986 | Lyng ......................... 292/148 |
| 5,078,634 | A | | 1/1992 | Yoshioka |
| 5,188,876 | A | * | 2/1993 | Hensel et al. ................. 428/76 |
| 5,505,985 | A | | 4/1996 | Nakamura et al. |
| 5,834,327 | A | | 11/1998 | Yamazaki et al. |
| 5,952,778 | A | * | 9/1999 | Haskal et al. ................ 313/504 |

(Continued)

FOREIGN PATENT DOCUMENTS

EP 0880307 A2 11/1998

(Continued)

OTHER PUBLICATIONS

Toru Takayama et al.; U.S. Patent Application entitled "Light-Emitting Apparatus and Fabrication Method of the Same" filed concurrently herewith (Sep. 16, 2003); Specification, claims, abstract, drawings—43 pages.

(Continued)

*Primary Examiner*—Ashok Patel
*Assistant Examiner*—Christopher M. Raabe
(74) *Attorney, Agent, or Firm*—Fish & Richardson P.C.

(57) ABSTRACT

The present invention is to solve the problems of heat release and a metal material corrosion due to fluorine that are arisen in the case of using a film containing fluoroplastics (Teflon®) as a protective film for a light-emitting device. In the present invention, an inorganic film is formed after forming a light-emitting device, and a film containing fluoroplastics is formed thereon for avoiding contact with a metal material for forming the light-emitting device, as a result, a metal material corrosion due to fluorine in the film containing fluoroplastics can be prevented. In addition, the inorganic insulating film has a function of preventing fluorine in the film containing fluoroplastics from reacting to the metal material (barrier property), in addition, the inorganic insulating film is formed of a material having high heat conductivity for releasing heat generated in a light-emitting device.

32 Claims, 8 Drawing Sheets

U.S. PATENT DOCUMENTS

| | | |
|---|---|---|
| 6,027,958 A | 2/2000 | Vu et al. |
| 6,118,212 A | 9/2000 | Nakaya et al. |
| 6,198,092 B1 * | 3/2001 | Bulovic et al. .......... 250/214.1 |
| 6,198,220 B1 | 3/2001 | Jones et al. |
| 6,274,887 B1 | 8/2001 | Yamazaki et al. |
| 6,372,608 B1 | 4/2002 | Shimoda et al. |
| 6,445,005 B1 | 9/2002 | Yamazaki et al. |
| 6,479,930 B1 | 11/2002 | Tanabe et al. |
| 6,488,555 B2 | 12/2002 | Pichler et al. |
| 6,583,440 B2 | 6/2003 | Yasukawa |
| 6,638,645 B2 | 10/2003 | Sawai et al. |
| 6,642,107 B2 | 11/2003 | Seo et al. |
| 6,652,938 B1 | 11/2003 | Nishikawa et al. |
| 6,689,492 B1 | 2/2004 | Yamazaki et al. |
| 6,792,333 B2 | 9/2004 | Yamazaki |
| 6,800,378 B2 | 10/2004 | Hawa et al. |
| 6,872,473 B2 | 3/2005 | Song et al. |
| 6,896,979 B2 | 5/2005 | Sawai et al. |
| 6,919,681 B2 | 7/2005 | Cok et al. |
| 6,943,369 B2 | 9/2005 | Hayashi |
| 2001/0026846 A1 * | 10/2001 | Yamazaki et al. .......... 427/535 |
| 2001/0055841 A1 * | 12/2001 | Yamazaki et al. .......... 438/151 |
| 2002/0056842 A1 | 5/2002 | Yamazaki |
| 2002/0057055 A1 | 5/2002 | Yamazaki et al. |
| 2002/0125817 A1 | 9/2002 | Yamazaki et al. |
| 2002/0153833 A1 | 10/2002 | Wu |
| 2002/0168545 A1 | 11/2002 | Sawai et al. |
| 2002/0190256 A1 | 12/2002 | Murakami et al. |
| 2003/0001992 A1 | 1/2003 | Kawase et al. |
| 2003/0030369 A1 | 2/2003 | Shih et al. |
| 2003/0032210 A1 | 2/2003 | Takayama et al. |
| 2003/0057422 A1 | 3/2003 | Yamazaki et al. |
| 2003/0064569 A1 | 4/2003 | Takayama et al. |
| 2003/0067266 A1 | 4/2003 | Kim et al. |
| 2003/0143319 A1 | 7/2003 | Park et al. |
| 2003/0213956 A1 | 11/2003 | Hioki et al. |
| 2004/0004214 A1 | 1/2004 | Yamazaki et al. |
| 2004/0061438 A1 | 4/2004 | Yamazaki et al. |
| 2004/0079950 A1 | 4/2004 | Takayama et al. |
| 2004/0099926 A1 | 5/2004 | Yamazaki et al. |
| 2004/0150332 A1 | 8/2004 | Hwang et al. |
| 2004/0187917 A1 | 9/2004 | Pichler |

FOREIGN PATENT DOCUMENTS

| | | |
|---|---|---|
| EP | 1 058 484 A1 | 12/2000 |
| JP | 60-115944 | 6/1985 |
| JP | 3-153859 | 7/1991 |
| JP | 05-036475 | 2/1993 |
| JP | 05-089959 | 4/1993 |
| JP | 05-101884 | 4/1993 |
| JP | 06-306591 | 11/1994 |
| JP | 2597047 | 1/1997 |
| JP | 10-125929 | 5/1998 |
| JP | 2002-260848 | 9/2002 |
| TW | 490868 | 6/2002 |

OTHER PUBLICATIONS

Search Report for U.S. Appl. No. 03021328.4, EP6617, dated May 15, 2007.

* cited by examiner

LIGHT-EMITTING APPARATUS

BACKGROUND OF THE INVENTION

1. Field of the Invention

The present invention relates to a light-emitting apparatus comprising a light-emitting device, which emits fluorescent light or phosphorescent light upon application of an electric field thereto, including a pair of electrodes and an electroluminescent layer that is sandwiched between the pair of electrodes, and to a method of fabricating the light-emitting apparatus. Particularly, the present invention relates to technique for preventing moisture or oxygen from penetrating into the light-emitting device formed on a substrate by using a film containing fluoroplastics. In this specification, the term light-emitting apparatus includes an image display apparatus, a light-emitting device, or a light source (including a lighting system). Also, the following modules are included in the light-emitting apparatus: a module obtained by attaching a connector such as an FPC (flexible printed circuit), a TAB (tape automated bonding) tape, or a TCP (tape carrier package) to a light-emitting device; a module obtained by providing a printed wiring board with a tip of a TAB tape or a TCP; and a module obtained by mounting directly an IC (integrated circuit) to a light-emitting device by the COG (chip on glass) system.

2. Description of the Related Art

A light-emitting device, in which a material characterized by their thinness and lightweight, fast response, and direct current low voltage driving is used as an illuminant, is expected to be applied to next-generation flat panel displays. Particularly, a light-emitting apparatus in which light-emitting devices are arranged in matrix are considered to be superior to the conventional liquid crystal display devices for their wide viewing angle and excellent visibility.

The luminescent mechanism of light-emitting device is as follows: voltage is applied to a pair of electrodes that sandwich an electroluminescent layer, and electrons injected from a cathode and holes injected from an anode are re-combined at the luminescent center of the electroluminescent layer to form molecular excitons, and then the molecular excitons return to the base state while releasing energy, consequently, luminescence is generated in the electroluminescent layer. Known excitation states are singlet excitation and triplet excitation, and it is considered that luminescence can be generated by either excitation states.

However, a light-emitting apparatus has a problem in the fabrication process, the problem is different from that of another display apparatuses such as a liquid crystal display apparatus, or the like.

It is known that a light-emitting device is deteriorated by moisture. Specifically, due to moisture, exfoliation between an electroluminescent layer and a electrode, deterioration of a material for forming an electroluminescent layer, generation of non light emitting portion referred to as a dark spot, or shrinkage of a light emitting portion resulting to inferior luminescence are seen in the light-emitting device. Such deterioration of the light-emitting device causes decreasing reliability of a light-emitting device in a long-time-driving.

The technique is known for solving the above described problems that Teflon®AF (a product by DuPont Corp.), polymer of Teflon® is formed by vapor deposition to seal a light-emitting device (for example, Reference 1: Patent Publication No. 2597047). Although the relative permittivity of Teflon® can be controlled to be from 1.9 to 2.1, there are concerns over ramifications of using Teflon® such as the thermal stability, metal fluorine reaction, or the like. Accordingly, there are problems that heat generated in a light-emitting device can not be released or a metal materials (an electrode or a wiring or the like) for forming the light-emitting device is corroded in the case of forming directly Teflon®AF on the device.

SUMMARY OF THE INVENTION

In view of the foregoing, it is an object of the present invention is to solve the problem of heat release and metal material corrosion due to fluorine that are arisen in the case of using a film containing fluoroplastics (Teflon®) as a protective film for a light-emitting device.

In the present invention, for solving the above described problems, an inorganic film is formed after forming a light-emitting device, and a film containing fluoroplastics is formed thereon with avoiding contact with a metal material for forming the light-emitting device, as the result, a metal material corrosion due to fluorine in the film containing fluoroplastics can be prevented.

In the present invention, an inorganic insulating film formed between a metal film of a light-emitting device (a second electrode) and a film containing fluoroplastics has a function of preventing fluorine in the film containing fluoroplastics from reacting to the metal material (barrier property), in addition, the inorganic insulating film is formed of a material having high heat conductivity for releasing heat generated in a light-emitting device. Specifically, an inorganic material such as silicon nitride, silicon oxynitride ($SiN_xO_y$), silicon oxide, aluminum nitride (AlN), aluminum oxynitride ($AlN_xO_y$), DLC (diamond like carbon) film, carbon nitride ($C_xN_y$) film, or the like is useful for the inorganic insulating film.

A concrete constitution according to the present invention is: a light-emitting apparatus having a light-emitting device including a first electrode, an electroluminescent film formed on the first electrode, and a second electrode formed on the electroluminescent film, comprising:

an inorganic insulating film formed on the second electrode; and a film containing fluoroplastics formed on the inorganic insulating film.

In the above constitution, a film containing fluoroplastics is formed on the inorganic insulating film that is formed to cover the metal material for the light-emitting device (the second electrode) for preventing deterioration of the light-emitting device due to moisture or gas such as oxygen or the like.

A film containing fluoroplastics according to the present invention is formed by sputtering using the target materials such as polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like.

Another constitution according to the present invention is that an organic insulating film is formed using an organic insulating material on an inorganic insulating film, and its surface is flattened, and then, a film containing fluoroplastics is formed.

Further, another more constitution is that an organic resin film is formed on an inorganic insulating film (a first insulating film), and another inorganic insulating film (a second insulating film) is formed thereon, and then, a film containing fluoroplastics is formed thereon.

In each above described constitution, the organic insulating film is formed any one of acrylic, polyamide, or polyimide.

Another concrete constitution is: a light-emitting apparatus having a light-emitting device including a first electrode connecting electrically to a TFT formed on a substrate via an insulating film, an electroluminescent film formed on the first electrode, and a second electrode formed on the electroluminescent film, comprising:

an inorganic insulating film formed on the second electrode; and a film containing fluoroplastics formed on the inorganic insulating film.

Thus, a film containing fluoroplastics that has a property of heat release for a light-emitting device and is capable of preventing a metal material corrosion due to fluorine can be formed as a protective film of the light emitting device.

In addition, a film containing fluoroplastics formed by sputtering can be formed on the surface of another finished product (the surface that is exposed to the air or man's hands).

DESCRIPTION OF THE PREFERRED EMBODIMENT

In Embodiment Mode 1, the case in which an inorganic insulating film that has a heat release property and a barrier property against fluorine, and a film containing fluoroplastics that has a function for preventing moisture or gas such as oxygen or the like from penetrating are stacked on a second electrode after forming the light-emitting device will be described with reference to FIG. 1.

In the present invention, there are a bottom emitting type light-emitting apparatus in which light generated in a light-emitting device emits in the direction of the substrate on which TFT is formed and a top emitting type light-emitting apparatus in which light generated in a light-emitting device emits in the opposite direction of the substrate. In this embodiment mode, the case of using a top emitting type light-emitting apparatus will be described.

Figure 1:
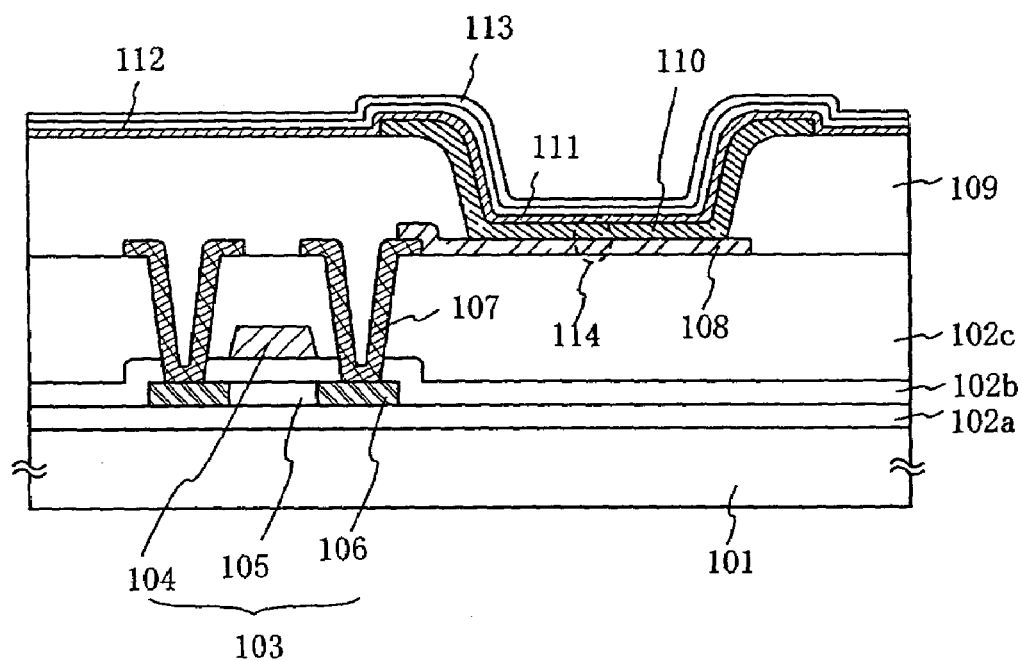
FIG. 1 is a view showing a structure of a light-emitting apparatus.

FIG. 1 is a cross-sectional view showing a part of a pixel portion. In FIG. 1, reference numeral 101 is a first substrate; 102a, 102b, 102c are insulating layers; 103 is a TFT (including a gate electrode 104, a channel formation region 105, and an impurity region 106); 107 is a wiring; 108 is a first electrode; 109 is an insulating film; 110 is an electroluminescent layer; 111 is a second electrode; 112 is an inorganic insulating film; and 113 is film containing fluoroplastics.

The insulating layer 102a that serves as a base insulating film (here, a bottom layer is a nitride insulating film, and an upper layer is an oxide insulating film) is formed on the first substrate 101, and the insulating layer 102b is formed between the gate electrode 104 and an active layer. The insulating layer 102c that serves as an interlayer insulating film formed of an organic material or an inorganic material is formed on the gate electrode 104.

The TFT 103 (here, p-channel TFT is used) formed on the first substrate 101 in contact with the insulating layer 102a is an element for controlling the current passing through the electroluminescent layer 110. Reference numeral 106 is an impurity region (a drain region or a source region). Reference numeral 107 is a wiring (also referred to as a drain electrode or a source electrode) for connecting a first electrode 108 to the impurity region 106. A current supply line, a source wiring, or the like is formed simultaneously in similar process.

Although not shown here, another not less than one TFT is provided per pixel (an n-channel TFT or a p-channel TFT).

In Embodiment Mode 1, the first electrode 108 serves as an anode. Therefore as a material for forming the first electrode, it is preferable to use a large work function material (not less than 4.0 eV). Specifically, TiN, TiSi$_x$N$_y$, WSi$_x$, WN$_x$, WSi$_x$, N$_y$, NbN, indium-tin-oxides (ITO), indium-zinc-oxides (IZO), an alloy of indium and one type or plural types of metallic oxides (for example, indium aluminum oxides, indium tungsten oxides, indium germanium oxides, indium titanium oxides, indium tantalum oxides, or the like), or ITO-SiO$_2$ (for example, In$_2$O$_3$:SnO$_2$:SiO$_2$=85:10:5 (wt %), or the like), in addition, an element selected from Ti, Ni, W, Mo, Cr, Pt, Zn, Sn, In, or Mo, a film containing mainly an alloy material or a compound material containing the above described element as its main component, or a lamination film having a total thickness from 100 to 800 nm is useful. Here, a titanium nitride film is used as the first electrode 108. In the case of using the titanium nitride film as the first electrode 108, it is preferable to increase the work function by plasma treatment using UV irradiation or gaseous chlorine.

An insulator 109 (also referred to as a bank) is formed that covers an edge portion of the first electrode 108 (and wiring 107). As a material for the insulator 109, an inorganic material (silicon oxide, silicon nitride, silicon oxynitride, or the like), a photosensitive organic material, a nonphotosensitive organic material (polyimide, acrylic, polyamide, polyimideamide, resist, or benzocyclobutene), or a lamination layer of these materials can be appropriately used. However, a photosensitive organic resin covered by a silicon nitride film is used for the insulator 109 here. In the case of using a positive type photosensitive acrylic is used as an organic resin material, it is preferable that an only upper edge portion of the insulator is formed to have a curved surface having a radius of curvature. Either a negative type that is a soluble material in etchant according to photosensitive light or a positive type that is dissoluble in etchant according to light can be used as an insulator.

The electroluminescent layer 110 is formed by vapor deposition or coating. In addition, it is preferable that the substrate is heated in vacuum (from 100 to 250° C.) for degasification just before forming the electroluminescent layer 110 in order to improve reliability.

In the case of forming the electroluminescent layer 110 by vapor deposition, for instance, white light emission can be obtained by forming the electroluminescent layer 110 having the configuration: an Alq$_3$ film, an Alq$_3$ film partially doped with Nile red which is a red luminescent pigment, an Alq$_3$ film, a p-EtTAZ film, and a TPD (aromatic diamine) film, sequentially.

On the other hand, when the electroluminescent layer 110 is formed by spin coating, the spin-coated film is preferable to be baked by vacuum heating. For example, an aqueous solution of poly(ethylene dioxythiopbene)/poly(styrene sulfonic acid) (PEDOT/PSS) is coated on the entire surface and baked to form a film that serves as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is coated on the entire surface and baked to form a film that serves as a light emitting layer.

Although the electroluminescent layer 110 may be formed to have a single layer structure. For example, a 1,3,4-oxadiazole derivative (PBD) having an electron transporting property is dispersed in polyvinyl carbazole (PVK) having hole transporting property. Another method to obtain white light emission is to disperse 30 wt % PBD as an electron transporting agent and disperse four kinds of pigments (TPB, coumarin 6, DCM1, and Nile red) in appropriate amounts.

In addition to the white-light-emitting device, red, green, and blue-light-emitting devices can be obtained by selecting appropriately a material for forming the electroluminescent layer 110.

Since a second electrode 111 serves as a cathode for a light-emitting device in Embodiment Mode 1, it is preferable to use a small work function material (not more than 3.5 eV) for forming the second electrode 111. Specifically, an alloy of MgAg, MgIn, AlLi, CaF$_2$, CaN, or the like, or a film that is transparent to light formed of an element belonging 1 group or 2 group in a periodic table and aluminum by co-evaporation.

The top emitting type light-emitting apparatus described in Embodiment Mode 1 requires the second electrode 111 to be transparent to light. Consequently, the second electrode 111 is formed using an aluminum film having a thickness from 1 nm to 10 nm, or an aluminum film containing slight amount of Li. In this case, a layer that is transparent to light can be formed of CaF$_2$, MgF$_2$, or BaF$_2$ (thickness from 1 to 5 nm) as a cathode buffer layer.

In order to decrease resistance of the second electrode 111, it can be formed to be a lamination structure of a thin metal film and a transparent conductive film (Indium-tin-oxide (ITO), indium oxide-zinc oxide (In$_2$O$_3$—ZnO), zinc oxide (ZnO), or the like). Otherwise, a support electrode can be formed on a part of the second electrode 111 that is not overlapped with a light-emitting region.

For an inorganic insulating film 112 that will be formed next, a silicon nitride film, a silicon oxide film, a silicon oxynitride film (SiNO film (in a composition ratio of N>O) or SiON film (in a composition ratio of N<O)), aluminum nitride, aluminum oxynitride, or a thin film containing carbon as its main components (for example, a DLC film, a CN film, or the like) formed by sputtering, CVD, or vapor deposition may be useful. The inorganic insulating film 112 is formed to have a thickness from 0.1 to 1 μm.

A film containing fluoroplastics 113 can be formed by sputtering or vapor deposition. The film containing fluoroplastics 113 protects the second electrode 111 and prevents moisture or gas such as oxygen or the like that cause deterioration of a light-emitting device from penetrating into a light-emitting device 114.

For fabrication of a film containing fluoroplastics 113 according to the present invention, the target of polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like is used.

Here, the case that the film containing fluoroplastics 113 is formed by sputtering is described here. The deposition is carried out under the conditions, that is, Ar gas used as process gas is 30 sccm (the 5 sccm O$_2$ gas can be used in addition to the Ar gas); sputtering pressure used is 0.4 Pa; electric power, 400 W; and the substrate temperature, 300° C. The film containing fluoroplastics 113 is formed to have a thickness from 0.1 to 5 μm. The film containing fluoroplastics 113 can be formed using a target of fluoroplastics by high-frequency sputtering with applying from 0.15 to 6.2 W per square centimeter high frequency electric power.

Thus, a film containing fluoroplastics 113 that has a property of heat release for a light-emitting device and is capable of preventing a metal material corrosion due to fluorine can be formed as a protective film of the light emitting device.

Figure 2:
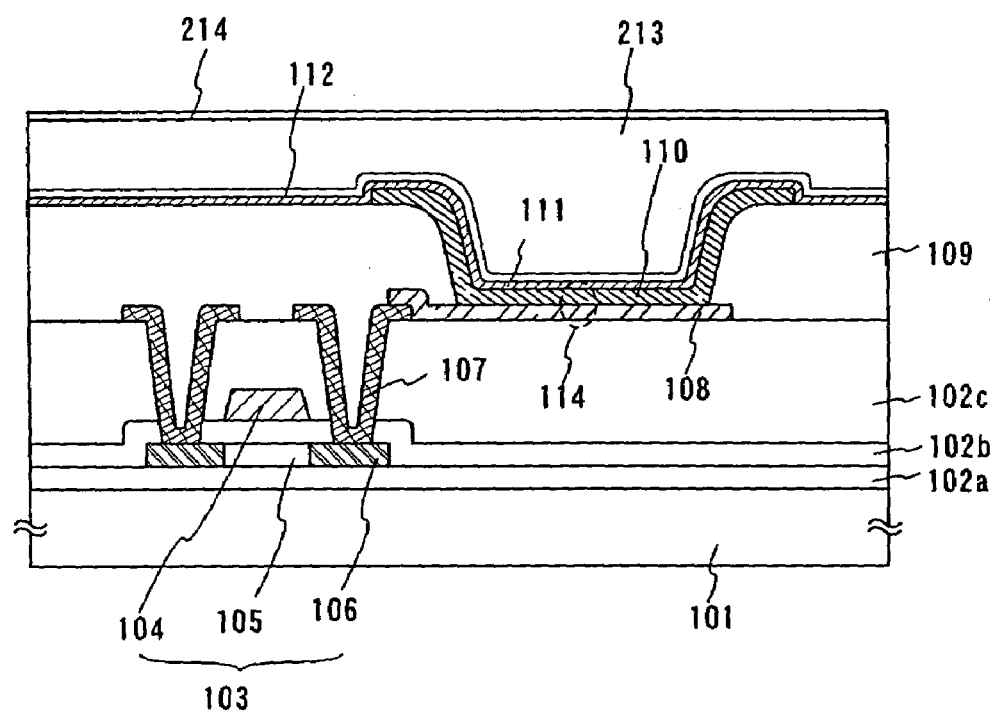
FIG. 2 is a view showing a structure of a light-emitting apparatus.

The case in which an inorganic insulating film and a film containing fluoroplastics are stacked on a second electrode 111 that has a different structure from that shown in FIG. 1 is described with reference to FIG. 2. In FIG. 2, like components are denoted by like numerals as of the Embodiment Mode 1 and will be explained in no more details.

FIG. 2 is illustrated the structure: a second electrode 111, an inorganic insulating film 112, an organic insulating film 213, and a film containing fluoroplastics 214, are formed sequentially. The organic insulating film 213 can be formed by spin-coating or coating. In addition, an organic material such as acrylic, polyimide, polyamide, polyimideamide, BCB (benzocyclobutene), or the like is also useful. Forming the organic insulating film 213 of an organic material gives the good flatness on the film surface, in addition, parasitic capacitance can be reduced since an organic material has generally low dielectric constant.

Figure 3:
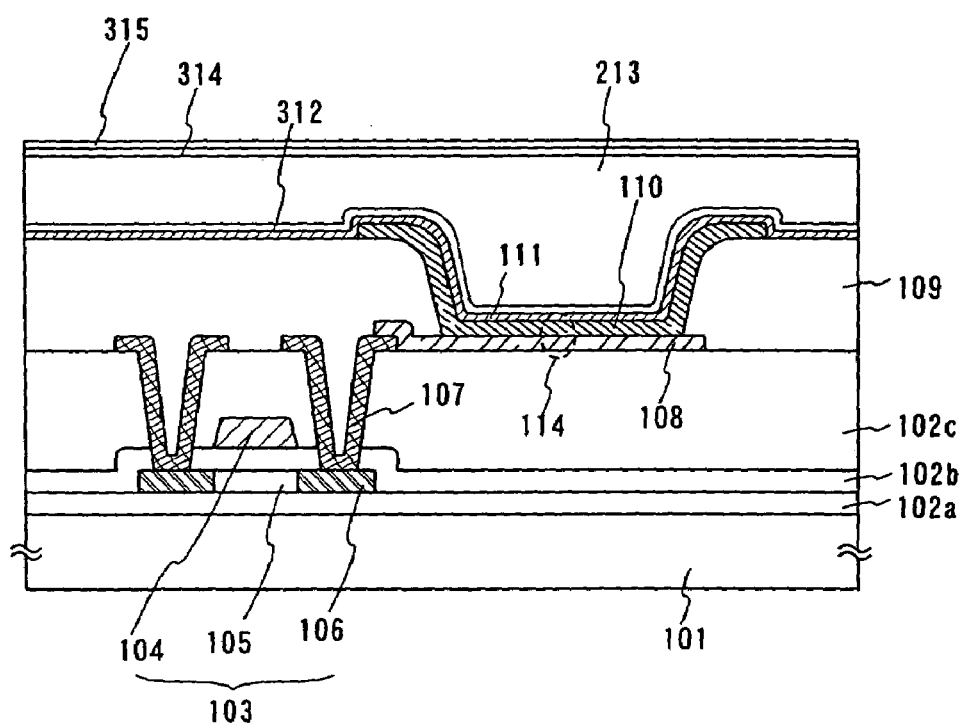
FIG. 3 is a view showing a structure of a light-emitting apparatus.

Further, the structure illustrated in FIG. 3 can be employed: a second electrode, an inorganic insulating film 312, an organic insulating film 213, a second insulating film 314, and an insulating film containing fluoroplastics 315 are formed sequentially.

In this case, the first insulating film 312 can be formed using a material that is used for forming inorganic insulating film 112 shown in FIG. 1 or 2 to have a thickness of in the same range. Also the second inorganic insulating film 314 formed on the organic insulating film 213 can be formed in the same way as that of the first inorganic insulating film 312. However, a material for the first insulating film 312 and the second insulating film 314 and thickness thereof are not necessary to be the same.

Embodiment Mode 2

In Embodiment Mode 2, measured results of the characteristics of the film containing fluoroplastics used in the present invention will be described. A film used for the measurement is the film containing fluoroplastics formed to have a thickness of 100 nm by using target of polytetrafluoroethylene by sputtering under the conditions, that is, Ar gas used as process gas is 30 sccm; sputtering pressure used is 0.4 Pa; electric power, 400 W; and the substrate temperature, 300° C.

Figure 6:
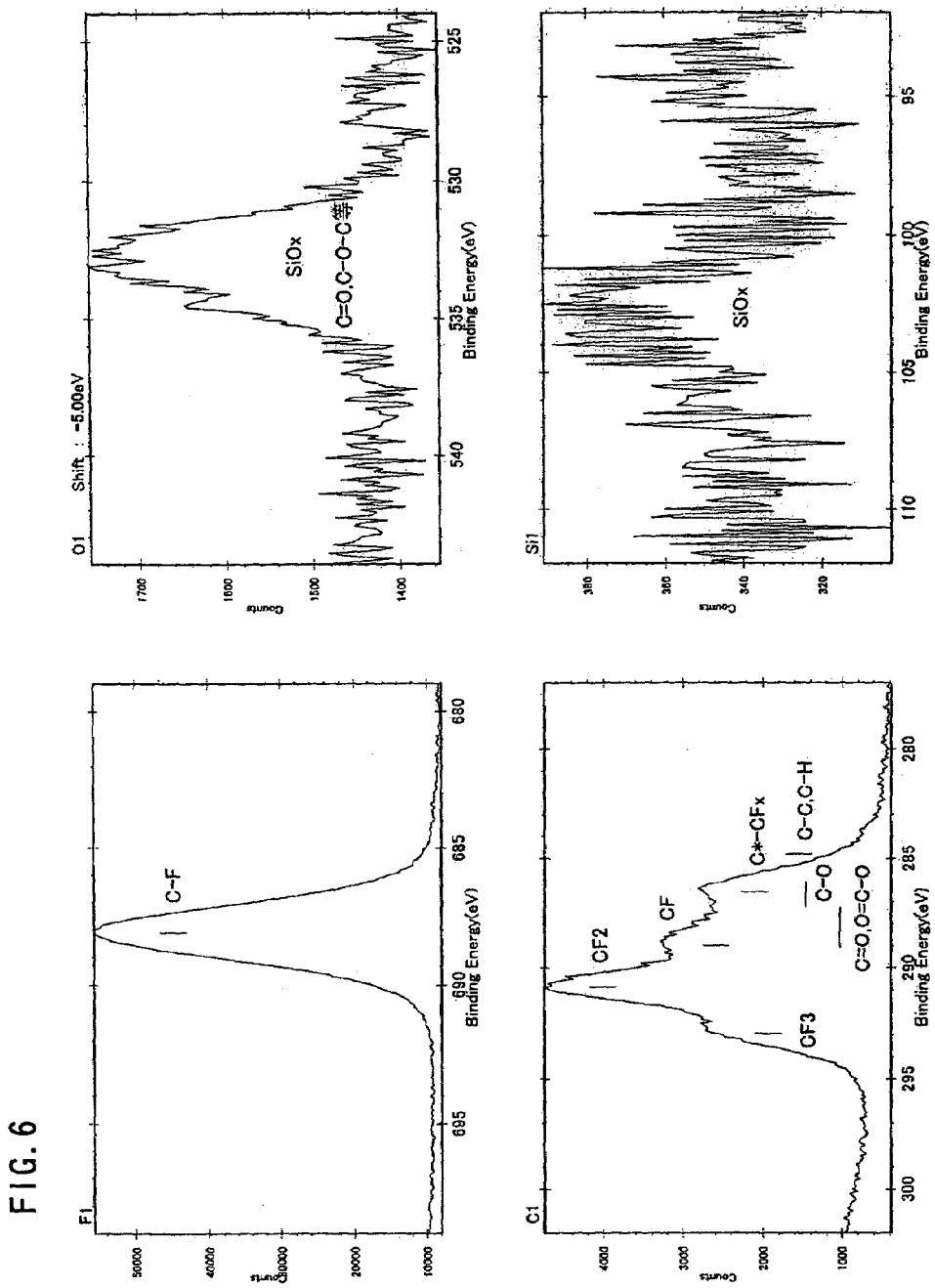
FIG. 6 is a view showing the ESCA measured results of a film containing fluoroplastics.

FIG. 6 is a view showing spectrums of ESCA (photoelectron spectroscopy for chemical analysis). Chemical composition of fluoride, oxygen, carbon, and silicon in the sample is in a ratio of 61:<1:38:<0.

Figure 7:
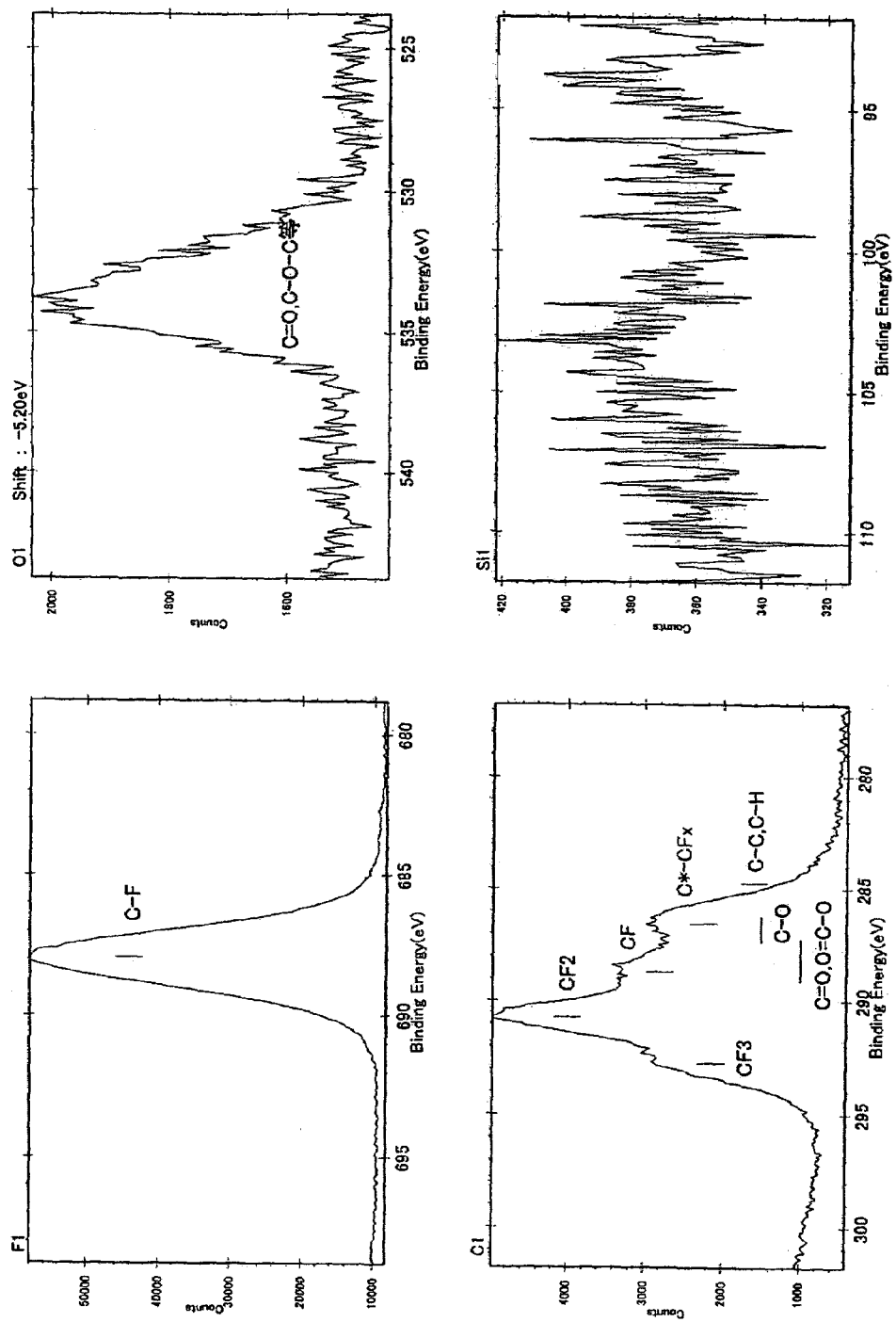
FIG. 7 is a view showing the ESCA measured results of a film containing fluoroplastics.

Measured results of a film formed by much the same measuring method in a different deposition condition is illustrated in FIG. 7. In this case, 30 sccm Ar gas and 5 sccm $O_2$ gas are introduced. The composition ratio is the same as the condition illustrated in FIG. 6.

Figure 8:
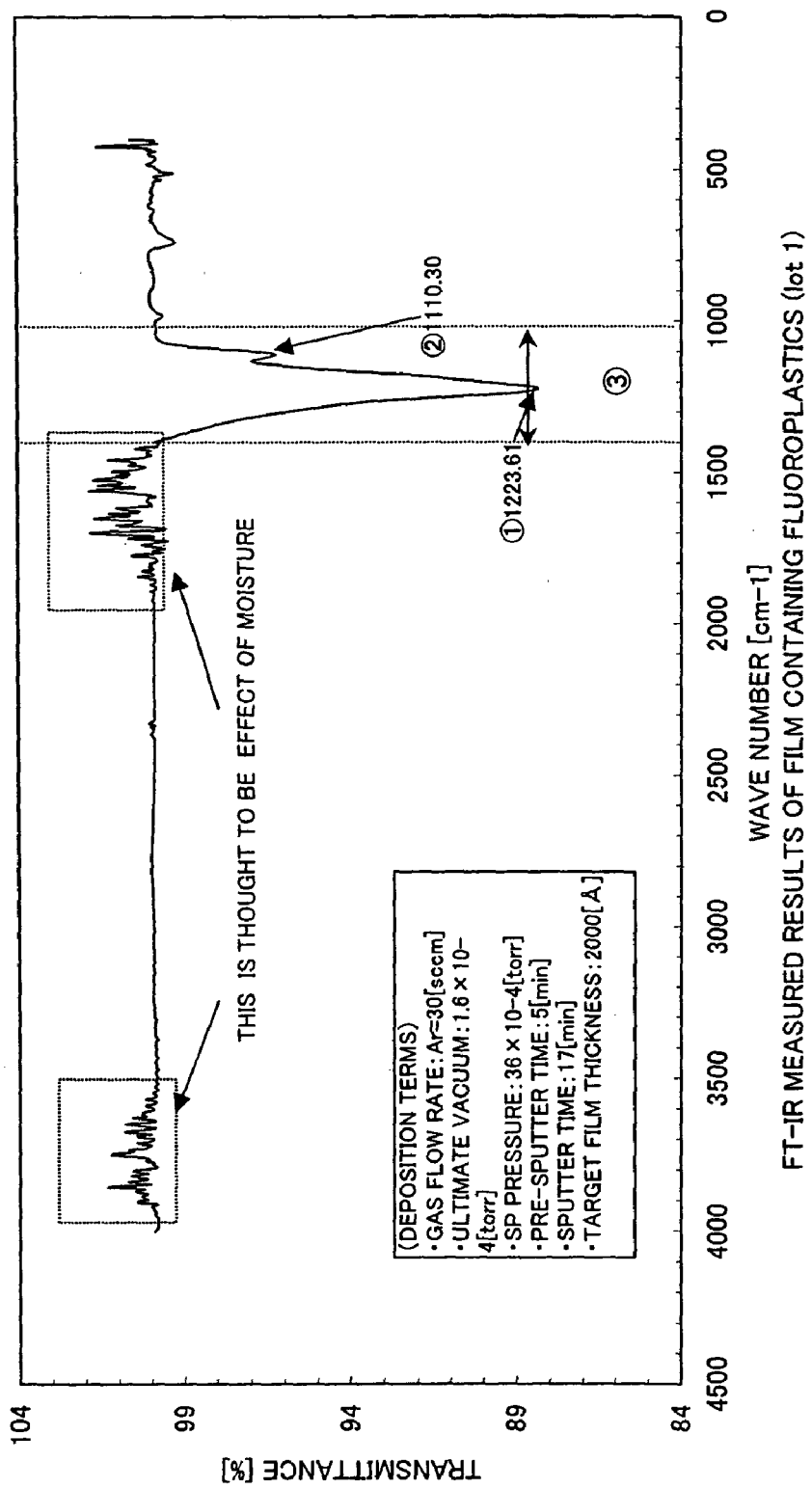
FIG. 8 is a view showing the IR measured results of a film containing fluoroplastics.

FIG. 8 is a graph showing qualitative analysis results by Fourier transform infrared spectroscopy (FT-IR). It is considered that reference numerals 1, 2, and 3 in FIG. 8 represent peaks derived from CF (1100 to 1000 cm$^{-1}$), $CF_2$ (1250 to 1070 cm$^{-1}$), and $CF_3$ (1360 to 1150 cm$^{-1}$). Since the peak represented by numeral 2 is distinctive, it can be thought that $CF_2$ is contained at high rates in the film containing fluoroplastics.

Embodiment Mode 3

Figure 4A:
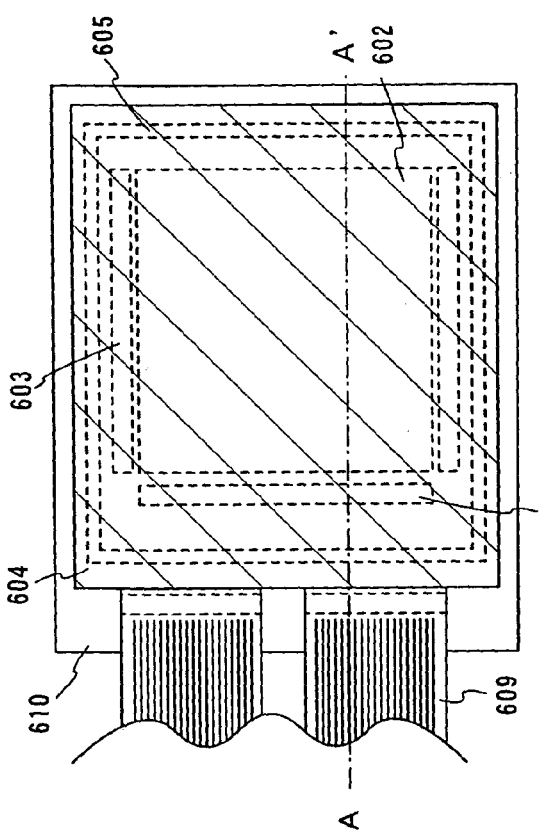
FIGS. 4A to 4B are views showing a sealing structure of a light-emitting apparatus according to the present invention.
Figure 4B:
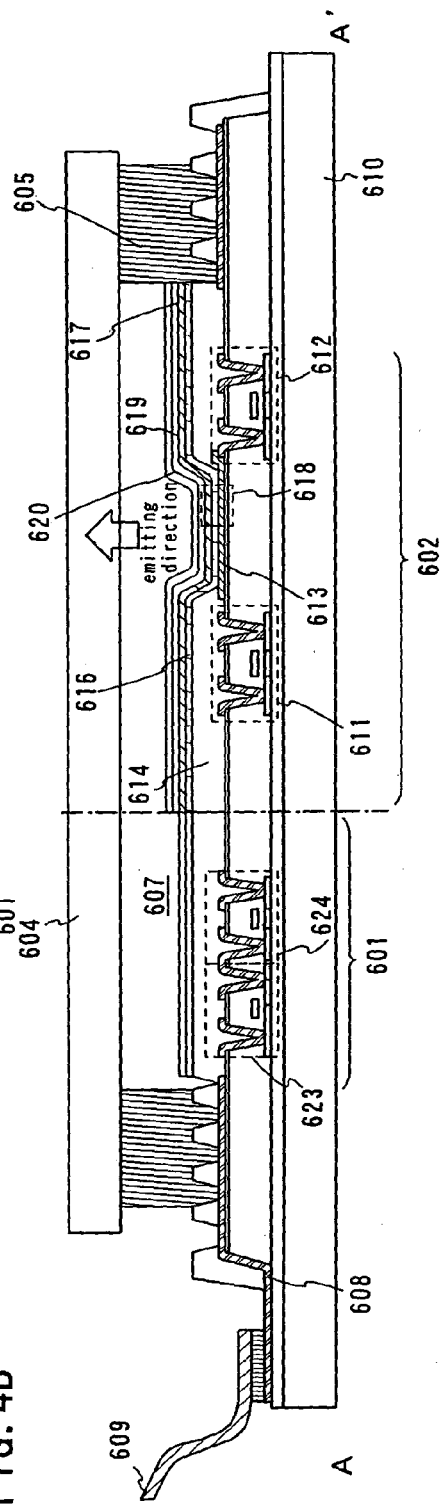

In Embodiment Mode 3, the external view of an active matrix type light-emitting apparatus will be described with reference to FIG. 4. FIG. 4A is a top surface view of a light-emitting apparatus and FIG. 4B is a cross-sectional view taken along the line of A-A' of FIG. 4A. Reference numeral 601 indicated by a dotted line is a drive circuit portion (a source side drive circuit), 602 is a pixel portion, 603 is a drive circuit portion (a gate side drive circuit), 604 is a sealing substrate, 605 is a sealing agent, and 607 surrounded by the sealing agent 605 is a space.

Reference numeral 608 is a wiring for transmitting signals to be inputted to the source side drive circuit 601 and a gate side drive circuit 603. The wiring 608 receives a video signal, a clock signal, a start signal, a reset signal, or the like from the FPC (a flexible printed circuit) 609 that serves as an external input terminal. Though only the FPC is illustrated here, a PWB (a print wiring board) can be attached to the FPC. The light-emitting apparatus in the specification includes not only a body of light-emitting apparatus but also a light-emitting apparatus in the state of being attached with FPC or PWB.

Next, a cross-sectional structure of a light emitting will be described with reference to FIG. 4B. Here, the source side drive circuit 601 portion that serves as a drive circuit portion and the pixel portion 602 are fabricated on a substrate 610.

The source side drive circuit 601 is a CMOS circuit that is formed by combining an n-channel TFT 623 and a p-channel TFT 624. A TFT for forming a drive circuit may be formed of a known CMOS circuit, PMOS circuit, or NMOS circuit. A drive circuit is formed on a substrate that is referred to a driver integrated type is described in this embodiment mode, but not exclusively, the drive circuit may be formed outside.

The pixel portion 602 comprises a switching TFT 611, a current control TFT 612, and a first electrode 613 that connects electrically to a drain of the current control TFT 612. An insulator 614 is formed to cover the edge portion of the first electrode 613. Here, the insulator 614 is formed of a positive type photosensitive acrylic resin film.

To improve coverage, the upper end portion or the bottom end portion of the insulator 614 is formed to have a curved surface having curvature. For example, in the case that the a positive type photosensitive acrylic is used as a material for the insulator 614, it is preferable that only the upper edge portion of the insulator 614 is formed to have a curved surface having radius of curvature (0.2 to 3 μm). Either a negative type that is a soluble material in etchant according to photosensitive light or a positive type that is dissoluble in etchant according to light can be used as an insulator 614.

An electroluminescent layer 616 and a second electrode 617 are formed respectively on the first electrode 613. Here, as a material for forming the first electrode 613, it is preferable to use a large work function materials. For example, a single layer of a titanium nitride film, a chrome film, a tungsten film, a Zn film, or Pt film, or a lamination of a film containing titanium nitride and aluminum as its main components and the above single layer, or a three-layer lamination of the film containing titanium nitride and aluminum as its main components, a titanium nitride film, and the above single layer, are useful for the first electrode 613. By forming the first electrode to have a lamination structure, resistance as a wiring can be low forming the ohmic contact to the electroluminescent layer 616. In addition, the first electrode can serve as an anode.

The electroluminescent layer 616 is formed by vapor deposition using an evaporation mask or ink-jetting.

As a material for the second electrode (cathode) 617 formed on the electroluminescent layer 616, a small work function material (Al, Ag, Li, Ca, or alloy of these materials such as MgAg, MgIn, AlLi, $CaF_2$, or CaN) is useful. Here, the second electrode (cathode) 617 is formed of a lamination of a thin metal film, a transparent conductive film (Indium-tin-oxide (ITO), indium oxide-zinc oxide ($In_2O_3$—ZnO), zinc oxide (ZnO), or the like) in order the second electrode to transmit light.

The second electrode 617 serves as a wiring in common with all of the pixels and connects electrically to the FPC 609 via a connection wiring 608.

An inorganic insulating film 619 is formed on the second electrode 617. A silicon nitride film, a silicon oxide film, a silicon oxynitride film (SiNO film (in a composition ratio of N>O) or SiON film (in a composition ratio of N<O)) or a thin film containing carbon as its main components (for example, a DLC film, a CN film, or the like) formed by sputtering, CVD, or vapor deposition may be useful for the inorganic insulating film 619.

A film containing fluoroplastics 620 is formed on the inorganic insulating film 619 by sputtering. Fluoroplastics such as polytetrafluoroethylene, tetrafluoroethylene-hexafluoropropylene copolymer, polychlorotrifluoroethylene, tetrafluoroethylene-ethylene copolymer, polyvinyl fluoride, polyvinylidene fluoride, or the like is useful for forming the film containing fluoroplastics 620.

By covering a light-emitting device 618 by the inorganic insulating film 619 and the film containing fluoroplastics 620, deterioration of the light-emitting device 618 due to penetration of moisture or gas such as oxygen into the light-emitting device 618 can be prevented. Further, the above described effects can be more enhanced by bonding the sealing substrate 604 to the substrate 610 using the sealant 605.

Therefore the light-emitting device 618 is encapsulated in the space 607 enclosed with the substrate 610, the sealing substrate 604, and the sealant 605.

It is preferable to use epoxy resin for forming the sealant 605. Further, preferably, these materials transmit little moisture or gas such as oxygen.

In this embodiment mode, in addition to a glass substrate, a quartz substrate, or the like, a plastic substrate of a FRP (fiberglass-reinforced plastics), a PVF (polyvinyl fluoride), a myler, a polyester, acrylic, or the like are useful for the sealing substrate 604.

Thus, it becomes possible to prevent moisture or gas such as oxygen or the like, which causes deterioration of the light-emitting device 618, from penetrating into the light-emitting device by encapsulating completely the light-emitting device 618 using inorganic insulating film 619, a film containing fluoroplastics 620, and a sealing substrate 604. Consequently, a high reliable light-emitting apparatus can be obtained.

This embodiment mode can be freely combined with Embodiment Mode 1 or Embodiment Mode 2.

Embodiment Mode 4

Since the light-emitting apparatus using a light-emitting device is a self-luminous type, it has high visibility in a light place and a wide viewing angle compared with a liquid crystal display apparatus. Therefore various electric appliances can be completed by employing the light-emitting apparatus according to the present invention.

Given as examples of electric appliances employing a light-emitting apparatus fabricated according to the present invention are: a video camera; a digital camera; a goggle type display (head mounted display); a navigation system; an audio reproducing device (car audio, an audio component, etc.); a laptop computer; a game machine; a portable information terminal (a mobile computer, a cellular phone, a portable game machine, an electronic book, etc.); and an image reproducing device (specifically, a device that is equipped with a display device for reproducing data in a recording medium such as a digital versatile disk (DVD)). The light-emitting apparatus using a light-emitting device is desirable particularly for a portable information terminal since its screen is often viewed obliquely and is required to have a wide viewing angle. Specific examples of the electric appliances are shown in FIGS. 5A to 5H.

Figure 5A:
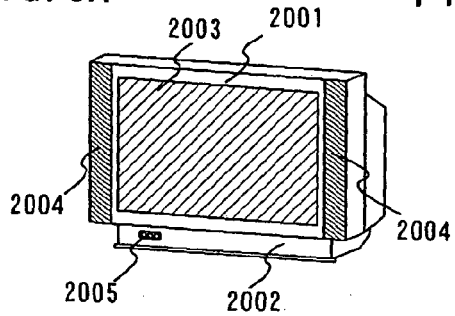
FIGS. 5A to 5H are views showing electric appliances.

FIG. 5A shows a display device, which comprises a casing 2001, a supporting base 2002, a display unit 2003, speaker units 2004, a video input terminal 2005, etc. The display device can be completed by using the light-emitting apparatus according to the present invention as the display unit 2003. The light-emitting apparatus having a light-emitting device is a self-luminous type and does not need a backlight, so that is can be formed into a thinner display device than that of a liquid crystal display device. The term display device includes all of the display device for displaying information such as one for a personal computer, one for receiving TV broadcasting, and one for advertisement.

Figure 5B:
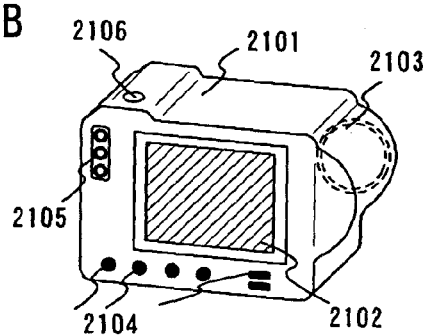

FIG. 5B shows a digital still camera, which comprises a main body 2101, a display unit 2102, an image receiving unit 2103, operation keys 2104, an external connection port 2105, a shutter 2106, etc. The digital still camera can be completed by using the light-emitting apparatus according to the present invention as the display unit 2102.

Figure 5C:
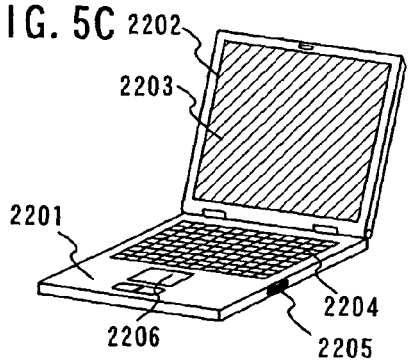

FIG. 5C shows a laptop computer, which comprises a main body 2201, a casing 2202, a display unit 2203, a keyboard 2204, an external connection port 2205, a pointing mouse 2206, etc. The laptop computer can be completed by using the light-emitting apparatus according to the present invention as the display unit 2203.

Figure 5D:
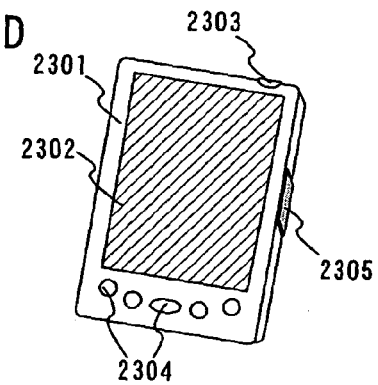

FIG. 5D shows a mobile computer, which comprises a main body 2301, a display unit 2302, a switch 2303, operation keys 2304, an infrared ray port 2305, etc. The mobile computer can be completed by using the light-emitting apparatus according to the present invention as the display unit 2302.

Figure 5E:
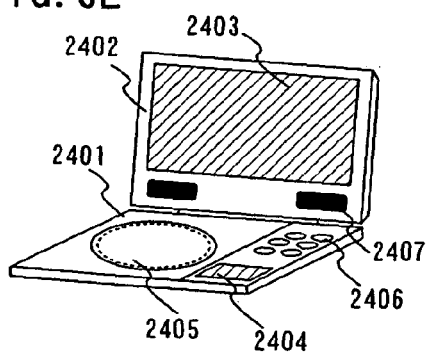

FIG. 5E shows a portable image reproducing device equipped with a recording medium (a DVD player, to be specific). The device comprises a main body 2401, a casing 2402, a display unit A 2403, a display unit B 2404, a recording medium (DVD, or the like) reading unit 2405, operation keys 2406, speaker units 2407, etc. The display unit A 2403 mainly displays image information whereas the display unit B 2404 mainly displays text information. The portable image-reproducing device can be completed by using the light-emitting apparatus according to the present invention as the display units A 2403 and B 2404. The term image reproducing device equipped with a recording medium includes video game machines.

Figure 5F:
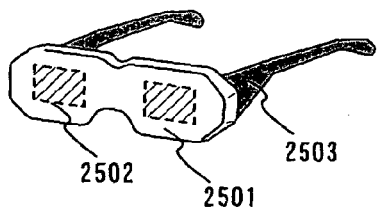

FIG. 5F shows a goggle type display (head mounted display), which comprises a main body 2501, display units 2502, and arm units 2503. The mobile computer can be completed by using the light-emitting apparatus according to the present invention as the display units 2502.

Figure 5G:
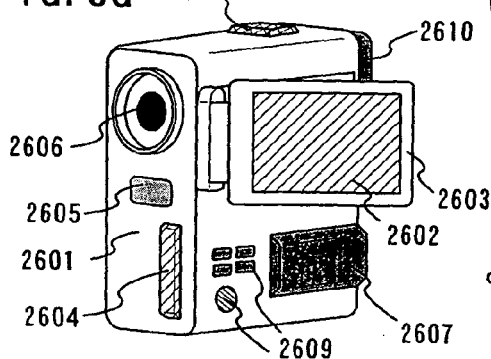

FIG. 5G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, an eye piece 2610, etc. The video camera can be completed by using the light-emitting apparatus according to the present invention as the display unit 2602.

Figure 5H:
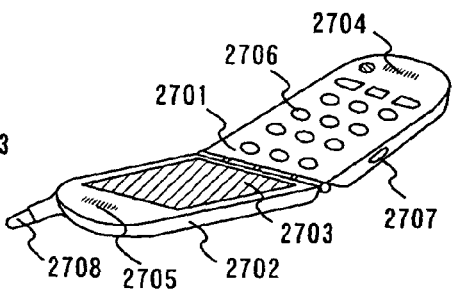

FIG. 5H shows a cellular phone, which comprises a main body 2701, a casing 2702, a display unit 2703, an audio input unit 2704, an audio output unit 2705, operation keys 2706, an external connection port 2707, an antenna 2708, etc. The video camera can be completed by using the light-emitting apparatus according to the present invention as the display unit 2703. If the display unit 2703 displays white characters on a black background, power consumption of the cellular phone can be reduced.

If the luminance of electroluminescence generated in organic compound materials is increased in future, the light-emitting apparatus can be employed also in a front or rear projector in which light bearing outputted image information is magnified by a lens or the like to be projected on a screen.

The electric appliances given in the above often displays information distributed through electronic communication lines such as Internet and CATV (cable television), especially, animation information with increasing frequency. The light-emitting apparatus is suitable for displaying animation information since organic light emitting materials have fast response speed.

In the light-emitting apparatus, portions that emit light consume power. Therefore it is desirable to display information such that as small portions as possible emit light. Accordingly, if the light-emitting apparatus is used for a display unit that mainly displays text information such as a portable information terminal, in particular, a cellular phone, and an audio reproducing device, it is desirable to assign light emitting portions to display text information while portions that do not emit light serve as the background.

As described above, the application range of the light-emitting apparatus according to the present invention is very wide and electric appliances of every field can employ the device. The electric appliances in Embodiment Mode 4 may use any of the structures shown in Embodiment Mode 1 to Embodiment Mode 3.

According to the present invention, by implementing the present invention, not only deterioration of the light-emitting device due to penetration of moisture or gas such as oxygen thereinto can be prevented, but also corrosion of a metal material for forming the light-emitting device can be prevented.

PARTS LIST 101 first substrate
102 (102a to 102c) insulating film
103 TFT
104 gate electrode
105 channel-forming region
106 impurity region
107 wiring
108 first electrode
109 insulator
110 electroluminescent layer
111 second electrode
112 inorganic insulating film
113 film containing fluoroplastics

What is claimed is:

1. A light-emitting apparatus comprising:
a light-emitting device including a first electrode formed over a first substrate, an electroluminescent film formed over the first electrode, and a second electrode formed over the electroluminescent film;
an inorganic insulating film formed in contact with the second electrode;
a film containing fluoroplastics formed over the inorganic insulating film; and
a sealing substrate positioned over the film containing fluoroplastics with a space interposed therebetween,
wherein the sealing substrate is bonded to the first substrate by a sealant so that the light-emitting device, the inorganic insulating film and the film containing fluorplastics are encapsulated.

2. A light-emitting apparatus according to claim 1, wherein the film containing fluoroplastics is one type of polymer selected from polytetrafluoroethylene, tetrafluoroethylene-hexafluoropropylene copolymer, polychlorotrifluoroethylene, tetrafluoroethylene-ethylenecopolyme copolymer, polyvinyl fluoride, and polyvinylidene fluoride.

3. A light-emitting apparatus according to claim 1, wherein the inorganic insulating film is one type selected from silicon nitride, silicon oxynitride, aluminum nitride, and aluminum oxynitride.

4. A light-emitting apparatus comprising:
a light-emitting device including a first electrode formed over a first substrate, an electroluminescent film formed over the first electrode, and a second electrode, formed over the electroluminescent film;
an inorganic insulating film formed over the second electrode;
an organic insulating film formed over the inorganic insulating film;
a film containing fluoroplastics formed over the organic insulating film; and
a sealing substrate positioned over the film containing fluorplastics.
wherein the sealing sunstrate is bonded to the first substrate by a sealant so that the light-emitting device, the inorganic insulating film, the organic insulting film and the film containing fluoroplastics are encapsulated.

5. A light-emitting apparatus according to claim 4, wherein the film containing fluoroplastics is one type of polymer selected from polytetrafluoroethylene, tetrafluoroethylene-hexafluoropropylene copolymer, polychlorotrifluoroethylene, tetrafluoroethylene-ethylene copolymer, polyvinyl fluoride, and polyvinylidene fluoride.

6. A light-emitting apparatus according to claim 4, wherein the inorganic insulating film is one type selected from silicon nitride, silicon oxynitride, aluminum nitride, and aluminum oxynitride.

7. A light-emitting apparatus according to claim 4, wherein the organic insulating film is formed of any one of acrylic, polyamide, or polyimide.

8. A light-emitting apparatus comprising:
a light-emitting device including a first electrode formed over a first substrate, an electroluminescent film formed over the first electrode, and a second electrode formed over the electroluminescent film;
a first inorganic insulating film formed over the second electrode;
an organic insulating film formed over the inorganic insulating film;
a second inorganic insulating film formed over the organic insulating film;
a film containing fluoroplastics formed over the second inorganic insulating film; and
a sealing substrate positioned over the film containing fluoroplastics,
wherein the sealing substrate is bonded to the first substrate by a sealant so that the light-emitting device, the first inorganic insulating film, the organic insulating film, the second inorganic insulting film and the film containing fluoroplastics are encapsulated.

9. A light-emitting apparatus according to claim 8, wherein the film containing fluoroplastics is one type of polymer selected from polytetrfluoroethylene, tetrafluoroethylene-hexafluoropropylene copolymer, polychlorotrifluoroethylene, tetrafluoroethylene-ethylene copolymer, polyvinyl fluoride, and polyvinylidene fluoride.

10. A light-emitting apparatus according to claim 8, wherein each the first inorganic insulating film and a second inorganic insulating film is one type selected from silicon nitride, silicon oxynitride, aluminum nitride, and aluminum oxynitride.

11. A light-emitting apparatus according to claim 8, wherein the organic insulating film is formed of any one of acrylic, polyamide, or polyimide.

12. A light-emitting apparatus comprising:
a light-emitting device including a first electrode connecting electrically to a TFT formed over a first substrate via an insulating film, an electroluminescent film formed over the first electrode, and a second electrode formed over the electroluminescent film;
an inorganic insulating film formed over the second electrode;
a film containing fluoroplastics formed over the inorganic insulating film; and
a sealing substrate positioned over the film containing fluoroplastics with a space interposed therebetween,
wherein the sealing substrate is bonded to the first substrate by a sealant so that the light-emitting device, the inorganic insulating film and the film containing fluoroplastics are encapsulated.

13. A light-emitting apparatus according to claim 12, wherein the film containing fluoroplastics is one type of polymer selected from polytetrafluoroethylene, tetrafluoroethylene-hexafluoropropylene copolymer, polychlorotrifltetrafluoroethylene-ethylene copolymer, polyvinyl fluoride, and polyvinylidene fluoride.

14. A light-emitting apparatus according to claim 12, wherein the inorganic insulating film is one type selected from silicon nitride, silicon oxynitride, aluminum nitrate and aluminum oxynitride.

15. A light-emitting apparatus comprising:
- a light-emitting device including a first electrode connecting electrically to a TFT formed over a first substrate via an insulating film, an electroluminescent film formed over the first electrode, and a second electrode formed over the electroluminescent film;
- an inorganic insulating film formed over the second electrode;
- an organic insulating film formed over the inorganic insulating film;
- a film containing fluoroplastics formed over the organic insulating film; and
- a sealing substrate positioned over the film containing fluoroplastics,
- wherein the sealing substrate is bonded to the first substrate by a sealant so that the light-emitting device, the inorganic insulating film, the organic insulating film and the film containing fluoroplastics are encapsulated.

16. A light-emitting apparatus according to claim 15, wherein the film containing fluoroplastics is one type of polymer selected from polytetrafluoroethylene, tetrafluoroethylene-hexafluoropropylene copolymer, polychlorotrifluoroethylene, tetrafluoroethylene-ethylene copolymer, polyvinyl fluoride, and polyvinylidene fluoride.

17. A light-emitting apparatus according to claim 15, wherein the inorganic insulating film is one type selected from silicon nitride, silicon oxynitride, aluminum nitride, and aluminum oxynitride.

18. A light-emitting apparatus according to claim 15, wherein the organic insulating film is formed of any one of acrylic, polyamide, or polyimide.

19. A light-emitting apparatus comprising:
- a light-emitting device including a first electrode connecting electrically to a TFT formed over a first substrate via an insulating film, an electroluminescent film formed over the first electrode, and a second electrode formed over the electroluminescent film;
- a first inorganic insulating film formed over the second electrode;
- an organic insulating film formed over the first inorganic insulating film;
- a second inorganic insulating film formed over the organic insulating film;
- a film containing fluoroplastics formed over the second inorganic insulating film; and
- a sealing substrate positioned over the film containing fluoroplastics,
- wherein the sealing substrate is bonded to the first substrate by a sealant so that the light-emitting device, the first inorganic insulating film, the organic insulating film, the second inorganic insulating film and the film containing fluoroplastics are encapsulated.

20. A light-emitting apparatus according to claim 19, wherein the film containing fluoroplastics is one type of polymer selected from polytetrafluoroethylene, tetrafluoroethylene-hexafluoropropylene copolymer, polychlorotrifluoroethylene, tetrafluoroethylene-ethylene copolymer, polyvinyl fluoride, and polyvinylidene fluoride.

21. A light-emitting apparatus according to claim 19, wherein each the first inorganic insulating film and a second inorganic insulating film is one type selected from silicon nitride, silicon oxynitride, aluminum nitride, and aluminum oxynitride.

22. A light-emitting apparatus according to claim 19, wherein the organic insulating film is formed of any one of acrylic, polyamide, or polyimide.

23. A light-emitting apparatus according to claim 1, wherein the light-emitting device is sealed by the first substrate and the sealing substrate.

24. A light-emitting apparatus according to claim 4, wherein the light-emitting device is sealed by the first substrate and the sealing substrate.

25. A light-emitting apparatus according to claim 8, wherein the light-emitting device is sealed by the first substrate and the sealing substrate.

26. A light-emitting apparatus according to claim 12, wherein the light-emitting device is sealed by the first substrate and the sealing substrate.

27. A light-emitting apparatus according to claim 15, wherein the light-emitting device is sealed by the first substrate and the sealing substrate.

28. A light-emitting apparatus according to claim 19, wherein the light-emitting device is sealed by the first substrate and the sealing substrate.

29. A light-emitting apparatus according to claim 4, wherein the sealing substrate is positioned over the film containing fluoroplastics with a space interposed therebetween.

30. A light-emitting apparatus according to claim 8, wherein the sealing substrate is positioned over the film containing fluoroplastics with a space interposed therebetween.

31. A light-emitting apparatus according to claim 15, wherein the sealing substrate is positioned over the film containing fluoroplastics with a space interposed therebetween.

32. A light-emitting apparatus according to claim 19, wherein the sealing substrate is positioned over the film containing fluoroplastics with a space interposed therebetween.

* * * * *